United States Patent
Salomon

(10) Patent No.: US 6,188,636 B1
(45) Date of Patent: Feb. 13, 2001

(54) CIRCUIT CONFIGURATION FOR DATA STORAGE

(75) Inventor: Oliver Salomon, Unterhaching (DE)

(73) Assignee: Infineon Technologies AG, Munich (DE)

(*) Notice: Under 35 U.S.C. 154(b), the term of this patent shall be extended for 0 days.

(21) Appl. No.: 09/157,661

(22) Filed: Sep. 21, 1998

(30) Foreign Application Priority Data

Sep. 19, 1997 (DE) ............................................. 197 41 426

(51) Int. Cl.[7] ..................................................... G11C 8/00

(52) U.S. Cl. ........................ 365/233; 327/202; 327/203; 327/212

(58) Field of Search ................................. 365/233, 154, 365/156; 327/202, 203, 208, 209, 211, 212

(56) References Cited

U.S. PATENT DOCUMENTS

| | | | |
|---|---|---|---|
| 4,629,909 | * 12/1986 | Cameron | 307/279 |
| 4,744,061 | * 5/1988 | Takemae et al. | 365/201 |
| 4,802,127 | * 1/1989 | Akaogi et al. | 365/189 |
| 5,132,577 | 7/1992 | Ward | 307/570 |
| 5,867,446 | * 2/1999 | Konishi et al. | 365/233 |

* cited by examiner

Primary Examiner—Richard Elms
Assistant Examiner—Hien Nguyen
(74) Attorney, Agent, or Firm—Herbert L. Lerner; Laurence A. Greenberg; Werner H. Stemer

(57) ABSTRACT

A circuit configuration for storing data has a first clocked register structure connected in parallel with a second register structure. The second register structure is operated in a push-pull mode relative to the first register structure. As a result, changes in the state of an input signal at the input are stored for each clock phase of a clock signal. Therefore, the clocking of the input signal of the circuit configuration can be done at the clock rate of the clock signal.

4 Claims, 2 Drawing Sheets

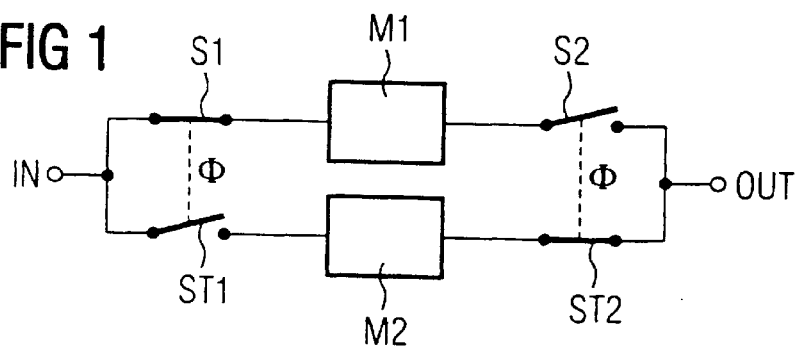
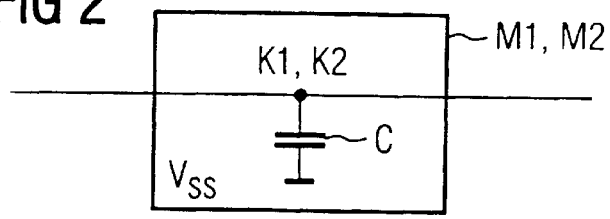
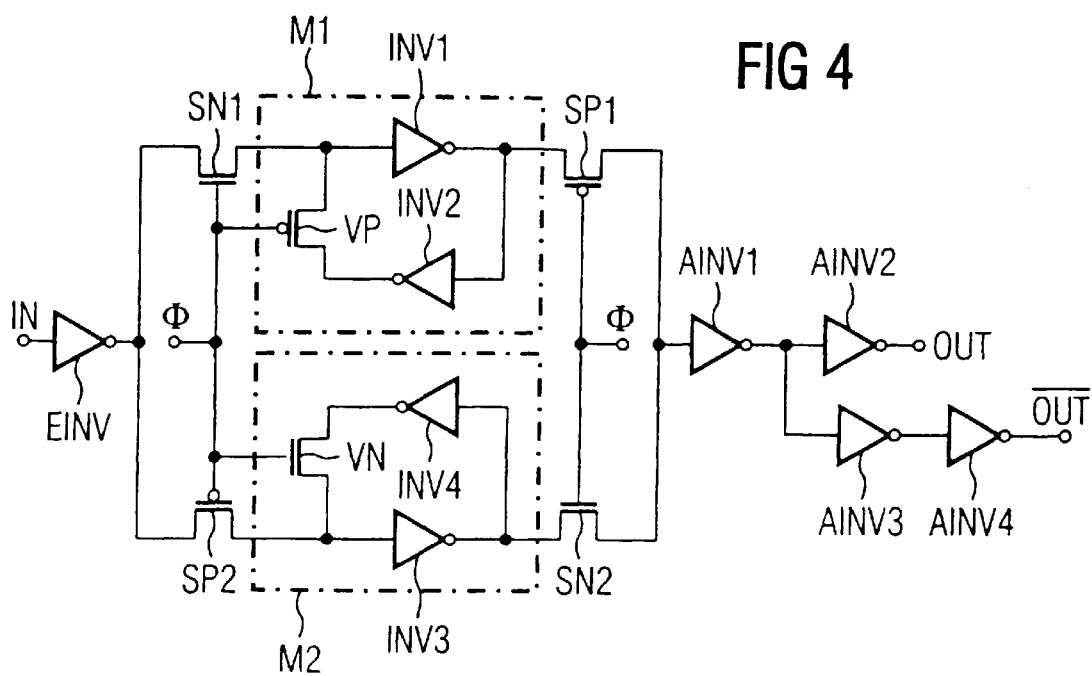

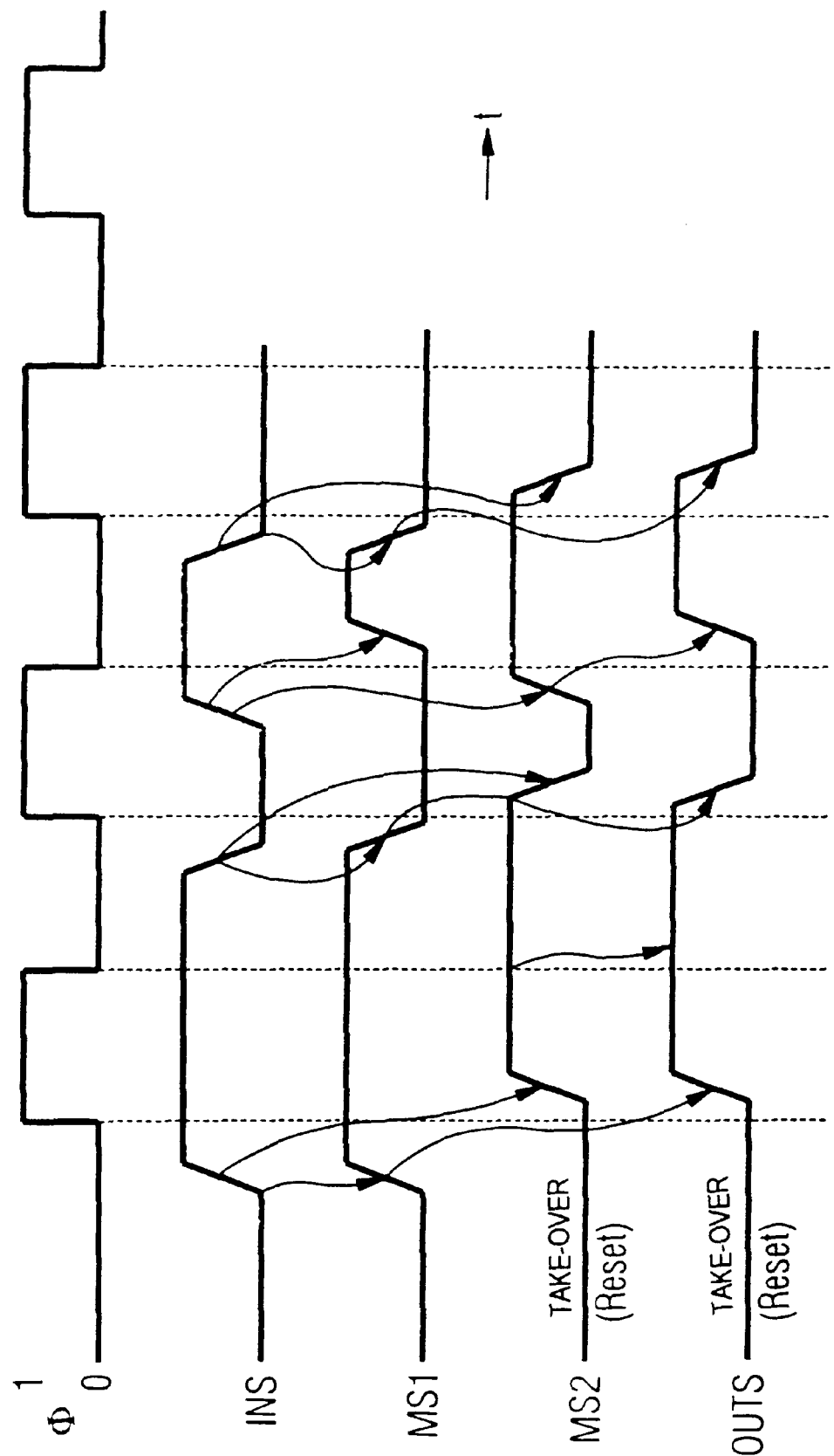

CIRCUIT CONFIGURATION FOR DATA STORAGE

BACKGROUND OF THE INVENTION

Field of the Invention

The invention relates to a circuit configuration for storing data, in which the data are written in and read out under clock control.

For storing data in the form of logic signals, particularly for brief buffer storage, it is well known to use registers. A register maintains its logic state until it is changed by a different logic signal or by special control commands.

The storage of the data can be done dynamically, for instance by changing the load state of a capacitor, or statically, for instance with a bistable multivibrator.

The transfer of data from the register is done usually at fixed times that are determined by a clock signal. The output of the register is released only in certain clock phases, for instance at a leading or trailing edge thereof. Complete decoupling of the input from the output of the register is obtained if the transfer of data to the register is also possible only at certain times fixed by the clock signal, and if the data transfer and entry take place at different times. The decoupling assures that a datum is not overwritten by a subsequent datum before it is read out. In principle, such a register includes a unit for storing a datum in memory, a clocked switch for transferring the data to the unit, and a clocked switch for takeover of the data from a precursor stage. At any time, the switches must assume different circuit states from one another. If one switch is opened, the other must be closed, and vice versa.

Relaying data from the input to the output of the register is made up of a transfer step, in which the data are transferred to the circuit, and a takeover step, in which the data are taken over by the circuit.

A disadvantage here is that a datum at the input of the register is not available at the output until after a period length. To store the data in memory without loss, the clock frequency of the clock signal must be twice as high as the frequency with which the data at the input of the register can change their state. In other words, changes in the state of the data can occur at only half the frequency of the clock signal.

SUMMARY OF THE INVENTION

It is accordingly an object of the invention to provide a circuit configuration for data storage which overcomes the hereinafore-mentioned disadvantages of the heretofore-known devices of this general type, in which a more-effective clock-controlled storage of data is provided.

With the foregoing and other objects in view there is provided, in accordance with the invention, a circuit configuration, including: an input terminal; an output terminal; a first memory device for storing data connected between the input terminal and the output terminal; first means connected in series with the first memory device, the first means receiving a clock signal for disconnecting the input terminal from the output terminal; a second memory device; second means connected in series with the second memory device, the second memory device and the second means connected in parallel with the first memory device and the first means, the second means being clocked in a push-pull fashion with the first means.

The invention has the advantage that the frequency with which the data can change their contents is equal to the frequency of the clock signal. In the circuit configuration of the invention, input data are stored at each trailing edge and each leading edge of a clock signal.

It is also advantageous that the power consumption per storage cycle is virtually unchanged compared with known circuit configuration for data storage.

In accordance with an added feature of the invention, the first means have a first MOS transistor of a first conductivity type is disposed upstream of the first memory device and a second MOS transistor of a second conductivity type is disposed downstream of the first memory device, and the second means have a first MOS transistor of the second conductivity type is disposed upstream of the second memory device and a second MOS transistor of the first conductivity type is disposed downstream of the second memory device.

In accordance with another feature of the invention, at least one of the first memory device and the second memory device has a pair of anti-parallel-connected inverters.

In accordance with an additional feature of the invention, at least one of the first memory device and the second memory device has an output terminal and a storage capacitor connected between the output terminal and a reference potential.

Other features which are considered as characteristic for the invention are set forth in the appended claims.

Although the invention is illustrated and described herein as embodied in a circuit configuration for data storage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a circuit configuration according to the invention;

FIG. 2 is a block circuit diagram of an exemplary embodiment of a storage device;

FIG. 3 is a timing diagram; and

FIG. 4 is a circuit diagram of the circuit configuration.

DESCRIPTION OF THE PREFERRED EMBODIMENTS

Referring now to the figures of the drawing in detail and first, particularly, to FIG. 1 thereof, there is shown a circuit configuration of the invention which has a first storage device M1 and first means S1, S2. Connected parallel to the first storage device M1 and the first means S1, S2 are a second storage device M2 and second means ST1, ST2. The first and second means S1, S2, ST1, ST2 are each clock-controlled. The first means S1, S2, in accordance with FIG. 1, are embodied as a first switch S1 upstream of the first storage device M1 and a second switch S2 downstream of the storage device M1. The switches S1, S2 are each controlled by one clock signal Φ. For a certain clock signal, such as a logical 1, the switch S1 is closed while the switch S2 is open.

The second switching means ST1 here includes a first parallel switch ST1 upstream of the second storage device M1 and a second parallel switch ST2 downstream of the second storage device M2. The parallel switches ST1, ST2 can also be supplied with the clock signal Φ.

At a certain time, the first parallel switch ST1 assumes the same state as the second switch S2, while the second parallel switch ST2 assumes the same state as the first switch SI.

A terminal of the first switch SI that is not connected to the first storage device M1, and a terminal of the first parallel switch ST1 that is not connected to the second storage device M2, are connected to one another and form an input IN of the circuit configuration. A terminal of the second switch S2 that is not connected to the first storage device M1, and a terminal of the second parallel switch ST2 that is not connected to the second storage device M2, are connected to one another and form an output OUT of the circuit configuration.

In FIG. 2, the first storage device M1 and the second storage device M2 can each be constructed from one capacitor C, which is connected between a reference potential $V_{ss}$ and an external terminal of the respective storage device M1, M2. The external terminal may be an input or an output terminal of the respective storage device M1, M2. In the first storage device M1, the connection of the capacitor C to the external terminal is configured as a node point K1, while in the second storage device M2 it is designated as node point K2.

The mode of operation of the circuit configuration of the invention as shown in FIG. 1 will be explained below in terms of FIG. 3. Without restricting the general applicability of the storage devices M1, M2, in each case, the embodiment having the storage capacitor C of FIG. 2 will be made the basis of the invention. The basic mode of operation of the circuit arrangement of the invention is not dependent on the embodiment of the storage devices M1, M2.

In the timing diagram of FIG. 3, the clock signal Φ, an arbitrarily selected input signal INS, a first memory signal MS1 which here appears at the first node point K1 of the storage device M1, a second memory signal MS2 that appears here at the second node point K2 of the storage device M2, and the output signal OUTS of the circuit configuration are plotted over time t.

It is assumed that for a logical zero of the clock signal Φ, the first switch S1 and the second parallel switch ST2 are closed, while the second switch S2 and the first parallel switch ST1 are open. For a logical one of the clock signal, the first switch S1 and the second parallel switch ST2 are open while the second switch S2 and the first parallel switch ST1 are closed.

It is also assumed that at the onset of observation, all the signals are logical zeros, for instance because of a reset.

While the clock signal Φ is logical 0, a leading edge of the input signal INS is reflected in the first memory signal MS1, after a brief delay dictated by the transit time of the signals. The second memory signal MS2 does not assume the logical state of the input signal INS, that is, logical 1, until some delay after the clock signal Φ is logical 1. Upon the change of the clock signal Φ to logical 1, the second switch S2 is closed, and the output signal OUTS, again with some delay, takes on the logical 1 of the memory signal MS1.

A trailing edge of the clock signal Φ following the leading edge remains at the first memory signal MS1, and the second memory signal MS2 and the output signal OUTS remain without effect, as long as the input signal INS remains at logical 1.

A trailing edge of the input signal INS is taken over by the first memory signal MS1 during the logical 0 of the clock signal Φ. The second memory signal MS2 does not assume the logical 0 of the input signal until the logical 1 of the clock signal Φ. At approximately the same time, the output signal OUTS takes over the logical 0 of the first memory signal MS1.

Another change of the input signal INS to logical 1, while the clock signal Φ is logical 1, is taken over by the second memory signal MS2, merely with some delay. The takeover of the logical 1 of the input signal INS takes place, for the first memory signal MS1, only after a change of the clock signal Φ to logical 0. At approximately this time, however, the logical 1 of the second memory signal MS2 is already relayed to the output signal OUTS.

A trailing edge of the input signal INS during a logical 0 of the clock signal Φ is taken over by the first memory signal MS1 with a slight delay. For the second memory signal MS2, the takeover of the logical 0 occurs only after the change of the clock signal Φ to logical 1. At approximately that time, the change of the output signal OUTS to logical 0 takes place, in response to the trailing edge of the first memory signal MS1.

A change in the state of the input signal INS is accordingly taken over by the output signal OUTS at each pulse edge, that is, both the leading edge and the trailing edge.

One possible conversion of the basic circuit of FIG. 1 into a concrete circuit is shown in FIG. 4. The exemplary embodiment of FIG. 4 has a first inverter INV1, which is connected on the input side to a first switching transistor SN1 of a first conduction type and on an output side to a second switching transistor SP1 of a second conduction type. Connected parallel to the first inverter INV1 is a series circuit of a locking transistor VP of the second conduction type and a second inverter INV2. An output of the first inverter INV1 is thus connected to an input of the second inverter INV2. Gate terminals of the first switching transistor SN1 of the first conduction type, the locking transistor VP of the second conduction type, and the second switching transistor SP1 of the second conduction type are connected to a terminal of the clock signal.

The exemplary embodiment of FIG. 4 further includes a third inverter INV3, which is connected on an input side to a third switching transistor SP2 of the second conduction type and on an output side to a fourth switching transistor SN2 of the first conduction type. Connected parallel to the third inverter INV3 is a series circuit including a second locking transistor VN of the first conduction type and a fourth inverter INV4. The output of the third inverter INV3 is thus connected to the input of the fourth inverter INV4. Gate terminals of the third switching transistor SP2 of the second conduction type, the second locking transistor VN, and the fourth switching transistor SN2 of the first conduction type are connected to a terminal of the clock signal Φ.

When the first locking transistor VP is conducting, the first inverter INV1 and the second inverter INV2 are connected anti-parallel. Analogously, the third inverter INV3 and the fourth inverter INV4 are connected anti-parallel, when the second locking transistor VN is conducting.

The channel side, remote from the first inverter INV1, of the first switching transistor SN1 of the first conduction type and the channel side, remote from the third inverter INV3, of the third switching transistor SP2 of the second conduction type are connected to the output of an input inverter EINV. On the input side, the input inverter EINV is connected to the input terminal IN of the circuit configuration.

A channel side, remote from the first inverter INV1, of the second switching transistor SP1 of the second conduction type and the channel side, remote from the third inverter INV3, of the fourth switching transistor SN2 of the first conduction type are connected to an input of a first output inverter AINV1. An output of the first output inverter AINV1 is connected to an input of a second output inverter AINV2 and is connected to the series circuit of a third and fourth output inverter AINV3, AINV4. The output of the second output inverter AINV2 is connected to the output terminal OUT of the circuit configuration. The output of the fourth output inverter AINV4, connected downstream of the third output inverter AINV3, is connected to an inverting output /OUT.

Both the input inverter EINV and all of the output inverters serve to increase the driver power. For the basic mode of operation of the exemplary embodiment, they are not significant. The first inverter INV1, the second inverter INV2, and the locking transistor VP of the second conduction type form the storage device M1. The third inverter INV3, the fourth inverter INV4, and the locking transistor VN of the first conduction type form the storage device M2.

In FIG. 4, the first switching transistor SN1 of the first conduction type is an n-channel transistor, and the third switching transistor SP2 of the second conduction type is a p-channel transistor. At each logic state of the clock signal Φ, the input signal INS is therefore stored in one of the storage devices M1, M2, namely in the storage device M2 at a logical 0 of the clock signal Φ and in the storage device M1 at a logical 1 of the clock signal Φ.

At a logical 1 of the clock signal Φ, the first switching transistor SN1 is opened, and the locking transistor VP of the second conduction type, in this case a p-channel transistor, is opened. The input signal INS is inverted by the first inverter INV1 and delivered to the second inverter INV2. If the clock signal Φ changes to logical 0, then the locking transistor VP of the second conduction type is made conducting. Because of the positive feedback structure of the first and second inverter INV1, INV2, the logical state of the storage device M1, which prevailed before the locking transistor VP of the second conduction type was made conducting, is maintained. Since the first switching SN1 transistor of the first conduction type is blocked at the logical 0 of the clock signal Φ, this state cannot be overwritten by the input signal INS during this clock phase.

The storage operation of the storage device M2 proceeds analogously.

The invention has been described in terms of a register of a 1-phase type, that is, with a 1-phase clock control. However, it can readily be expanded to multiphase clock systems as well.

I claim:

1. A circuit configuration, comprising:
   an input terminal for receiving data;
   an output terminal for outputting data;
   a first memory device for storing data and having an output and an input;
   a second memory device for storing data and having an output and an input;
   a first input switch having one side connected to said input terminal and another side connected to said input of said first memory device, said first input switch responsive to an applied clock signal for connecting said input of said first memory device to said input terminal during a first logic state of the clock signal;
   a second input switch having one side connected to said input terminal and another side connected to said input of said second memory device, said second input switch responsive to the clock signal for connecting said input of said second memory device to said input terminal during a second logic state of the clock signal;
   a first output transistor including a drain-source path with one side connected to said output of said first memory device and another side connected to said output terminal, said first output transistor configured to connect said output of said first memory device to said output terminal during the second logic state of the clock signal; and
   a second output transistor including a drain-source path with one side connected to said output of said second memory device and another side connected to said output terminal, said second output transistor configured to connect said output of said second memory device to said output terminal during the first logic state of the clock signal.

2. The circuit configuration according to claim 1, wherein said first output transistor is of a first conduction type and said second output transistor is of a second conduction type opposite said first conduction type.

3. The circuit configuration of claim 1, wherein at least one of said first memory device and said second memory device has a pair of anti-parallel-connected inverters.

4. The circuit configuration according to claim 1, wherein at least one of said first memory device and said second memory device has an output terminal and a storage capacitor connected between said output terminal and a reference potential.

* * * * *